United States Patent
Ng et al.

(10) Patent No.: US 9,892,974 B2
(45) Date of Patent: Feb. 13, 2018

(54) VERTICAL POWER MOSFET AND METHODS OF FORMING THE SAME

(71) Applicant: Taiwan Semiconductor Manufacturing Company, Ltd., Hsin-Chu (TW)

(72) Inventors: Chun-Wai Ng, Hsin-Chu (TW); Hsueh-Liang Chou, Jhubei (TW); Po-Chih Su, New Taipei (TW); Ruey-Hsin Liu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 41 days.

(21) Appl. No.: 14/802,239

(22) Filed: Jul. 17, 2015

(65) Prior Publication Data
US 2015/0325485 A1 Nov. 12, 2015

Related U.S. Application Data

(60) Division of application No. 13/588,893, filed on Aug. 17, 2012, now Pat. No. 9,087,920, which is a
(Continued)

(51) Int. Cl.
*H01L 21/8234* (2006.01)
*H01L 21/266* (2006.01)
(Continued)

(52) U.S. Cl.
CPC .... *H01L 21/823487* (2013.01); *H01L 21/266* (2013.01); *H01L 21/26513* (2013.01);
(Continued)

(58) Field of Classification Search
CPC ......... H01L 21/83487; H01L 21/26513; H01L 21/266; H01L 21/30604; H01L 21/82385;
(Continued)

(56) References Cited

U.S. PATENT DOCUMENTS

| 5,296,393 A | 3/1994 | Smayling et al. |
| 6,703,665 B1 * | 3/2004 | Nakamura .......... H01L 29/0634 257/139 |

(Continued)

FOREIGN PATENT DOCUMENTS

| CN | 102037558 | 4/2011 |
| JP | 2005072356 | 3/2005 |

(Continued)

OTHER PUBLICATIONS

K. Shimizu et al., A 600v HVIC Process with a Built-In EPROM Which Enables New Concept Gate Driving, Proceedings of 2004 International Symposium on Power Semiconductors Devices and ICs, p. 379-382.
(Continued)

*Primary Examiner* — Cheung Lee
*Assistant Examiner* — Stephen C Smith
(74) *Attorney, Agent, or Firm* — Slater Matsil, LLP

(57) ABSTRACT

A device includes a semiconductor layer of a first conductivity type, and a first and a second body region over the semiconductor layer, wherein the first and the second body regions are of a second conductivity type opposite the first conductivity type. A doped semiconductor region of the first conductivity type is disposed between and contacting the first and the second body regions. A gate dielectric layer is disposed over the first and the second body regions and the doped semiconductor region. A first and a second gate electrode are disposed over the gate dielectric layer, and overlapping the first and the second body regions, respectively. The first and the second gate electrodes are physically separated from each other by a space, and are electrically interconnected. The space between the first and the second gate electrodes overlaps the doped semiconductor region. The device further includes a MOS containing device.

20 Claims, 24 Drawing Sheets

Related U.S. Application Data continuation-in-part of application No. 13/486,633, filed on Jun. 1, 2012, now Pat. No. 8,884,369.

(51) Int. Cl.

| | | |
|---|---|---|
| *H01L 21/306* | (2006.01) | |
| *H01L 29/66* | (2006.01) | |
| *H01L 21/265* | (2006.01) | |
| *H01L 29/10* | (2006.01) | |
| *H01L 29/40* | (2006.01) | |
| *H01L 27/092* | (2006.01) | |
| *H01L 21/8238* | (2006.01) | |

(52) U.S. Cl.
CPC .. *H01L 21/30604* (2013.01); *H01L 21/82385* (2013.01); *H01L 21/823885* (2013.01); *H01L 21/823892* (2013.01); *H01L 27/0922* (2013.01); *H01L 27/0928* (2013.01); *H01L 29/1095* (2013.01); *H01L 29/402* (2013.01); *H01L 29/66666* (2013.01); *H01L 29/66712* (2013.01)

(58) Field of Classification Search
CPC ......... H01L 21/823892; H01L 27/0922; H01L 27/0928; H01L 29/1095; H01L 29/402; H01L 29/66666; H01L 29/66712
See application file for complete search history.

(56) References Cited

U.S. PATENT DOCUMENTS

| | | |
|---|---|---|
| 7,638,841 B2 | 12/2009 | Challa |
| 7,642,617 B2 | 1/2010 | Chen et al. |
| 7,915,617 B2 | 3/2011 | Ogura et al. |
| 7,923,771 B2 | 4/2011 | Miyakoshi |
| 7,989,293 B2 | 8/2011 | Blanchard et al. |
| 8,013,391 B2 | 9/2011 | Yedinak et al. |
| 8,089,129 B2 | 1/2012 | Disney et al. |
| 8,129,245 B2 | 3/2012 | Yedinak et al. |
| 8,143,124 B2 | 3/2012 | Challa et al. |
| 8,390,127 B2 | 3/2013 | Wei et al. |
| 2002/0036326 A1 | 3/2002 | DeJong et al. |
| 2002/0177277 A1 | 11/2002 | Baliga |
| 2003/0122195 A1 | 7/2003 | Tada et al. |
| 2003/0227052 A1 | 12/2003 | Ono et al. |
| 2004/0099905 A1* | 5/2004 | Baliga ................. H01L 29/0878 257/328 |
| 2006/0214221 A1 | 9/2006 | Challa et al. |
| 2007/0023830 A1 | 2/2007 | Pfirsch et al. |
| 2007/0075364 A1 | 4/2007 | Sin et al. |
| 2007/0278571 A1* | 12/2007 | Bhalla ................. H01L 29/0847 257/341 |
| 2008/0246086 A1 | 10/2008 | Korec et al. |
| 2009/0218621 A1 | 9/2009 | Pfirsch et al. |
| 2010/0301410 A1 | 12/2010 | Hirler |
| 2012/0126314 A1 | 5/2012 | Braithwaite et al. |
| 2012/0220091 A1 | 8/2012 | Challa et al. |
| 2013/0082321 A1* | 4/2013 | Sobti ................. H01L 29/42368 257/329 |
| 2013/0320430 A1 | 12/2013 | Ng et al. |
| 2015/0056770 A1 | 2/2015 | Ng et al. |

FOREIGN PATENT DOCUMENTS

| | | |
|---|---|---|
| KR | 100749186 | 8/2007 |
| KR | 20030045642 | 8/2007 |
| TW | 200636993 | 6/2006 |
| TW | 201013928 | 4/2010 |
| TW | 201032278 | 9/2010 |
| TW | 201216473 | 4/2012 |

OTHER PUBLICATIONS

Xu et al., "Dummy Gated Radio Frequency VDMOSFET with High Breakdown Voltage and Low Feedback Capacitance," Proceedings of the 12th International Symposium on Power Semiconductor Devices and ICs, ISPSO •2000, IEEE, Toulouse, France May 22-25, 2000, pp. 385-388.

* cited by examiner

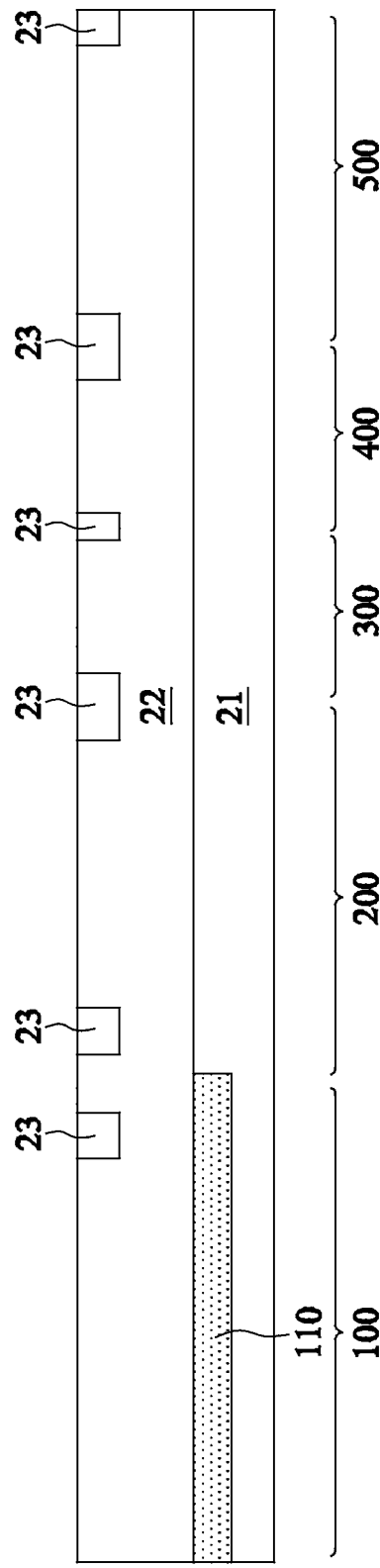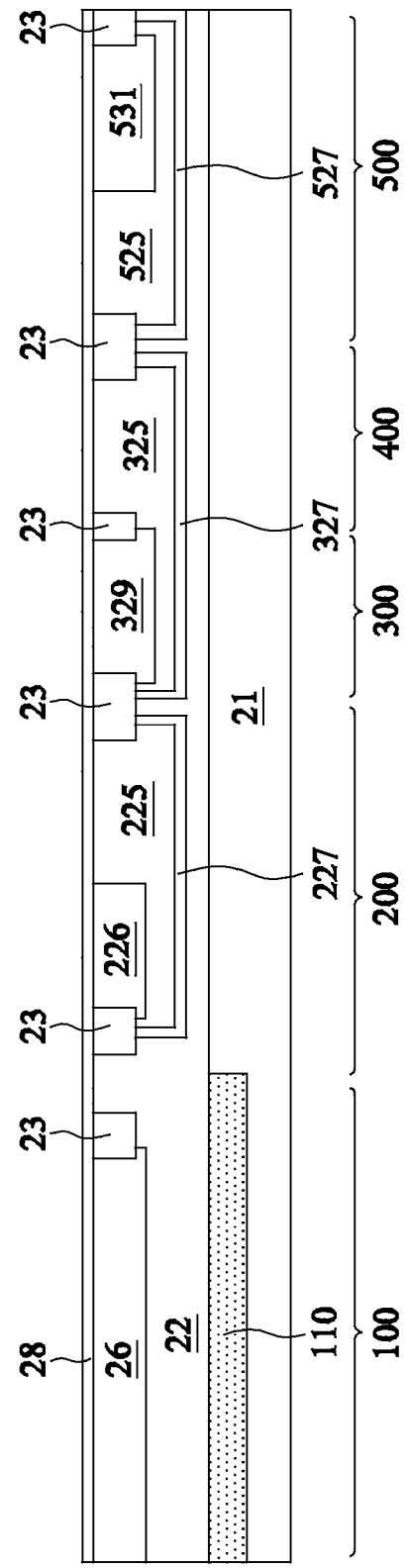
Fig. 3A
Fig. 3B

VERTICAL POWER MOSFET AND METHODS OF FORMING THE SAME

PRIORITY CLAIM AND CROSS-REFERENCE

This application is a divisional of U.S. patent application Ser. No. 13/588,893, filed Aug. 17, 2012 which is a continuation-in-part of U.S. patent application Ser. No. 13/486,633, filed Jun. 1, 2012, and entitled "Vertical Power MOSFET and Methods of Forming the Same," which application is hereby incorporated herein by reference.

BACKGROUND

In a conventional vertical power Metal-Oxide-Semiconductor Field Effect Transistor (MOSFET), two p-body regions are formed in an n-type epitaxy region. The vertical power MOSFET are such named since its source and drain regions are overlapped. A portion of the epitaxy region between the two p-body regions is lightly doped to form an n-type doped region, which is sometimes known as an N-type Junction Field Effect Transistor (n-JFET) region. The p-body regions and the n-JFET region are under a gate dielectric and a gate electrode. When the gate is applied with a positive voltage, inversion regions of electrons are formed in the p-body regions. The inversion regions act as the channel regions that connect the source region of the vertical power MOSFET to the n-JFET region, which is further connected to the drain region of the power MOSFET through the n-type epitaxy region. Accordingly, a source-to-drain current is conducted from the source region to the channels in the p-body regions, the n-JFET region, the epitaxy region, and then to the drain region.

The n-JFET region is underlying the gate electrode, with the gate dielectric layer disposed between the n-JFET region and the gate electrode. There is a large overlap area between the gate electrode and the n-JFET region. As a result, there is a significant gate-to-drain capacitance, which adversely affects the performance, including the speed, of the vertical MOSFET. Furthermore, the n-JFET region is lightly doped since is it a part of the n-type epitaxy region. The resistance of the n-JFET region is thus high, which adversely affects the drive current of the vertical power MOSFET.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are illustrative, and do not limit the scope of the disclosure.

A vertical power Metal-oxide-Semiconductor Field Effect Transistor (MOSFET) and the method of forming the same are provided in accordance with various exemplary embodiments. The intermediate stages of forming the vertical power MOSFET are illustrated. The variations of the embodiments are discussed. Throughout the various views and illustrative embodiments, like reference numbers are used to designate like elements.

Figure 1A:
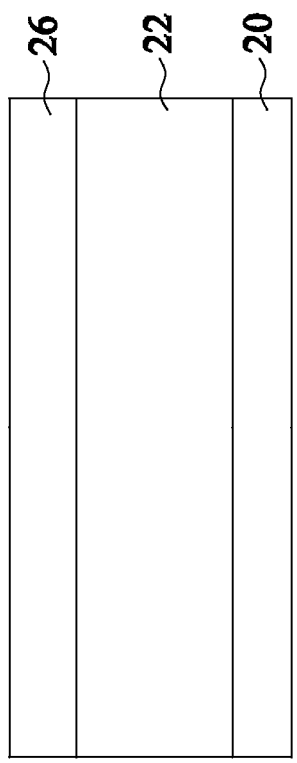
FIGS. 1A through 1F are cross-sectional views of intermediate stages in the manufacturing of a vertical power Metal-Oxide-Semiconductor Field Effect Transistor (MOSFET) in accordance with some exemplary embodiments.

FIGS. 1A through 1F are cross-sectional views of intermediate stages in the formation of an n-type vertical power MOSFET. Referring to FIG. 1A, semiconductor region 20, which is a portion of a semiconductor substrate, is provided. Semiconductor region 20 and the respective semiconductor substrate may have a crystalline silicon structure. Alternatively, semiconductor region 20 and the respective semiconductor substrate may be formed of other semiconductor materials such as silicon germanium. The semiconductor substrate may be a bulk substrate. In some embodiments, semiconductor region 20 is a heavily doped layer doped with an n-type impurity such as phosphorous or arsenic, for example, to an impurity concentration between about $10^{19}/cm^3$ and about $10^{21}/cm^3$. In the described embodiments, the term "heavily doped" means an impurity concentration of above about $10^{19}/cm^3$. One skilled in the art will recognize, however, that heavily doped is a term of art that depends upon the specific device type, technology generation, minimum feature size, and the like. It is intended, therefore, that the term be interpreted in light of the technology being evaluated and not be limited to the described embodiments.

Over heavily doped semiconductor region 20, epitaxy layer 22 is formed through epitaxy, and is lightly doped with an n-type impurity. The impurity concentration of epitaxy layer 22 may be between about $10^{15}/cm^3$ and about $10^{18}/cm^3$. Epitaxy layer 22 may be a silicon layer, although other semiconductor material may be used.

Body layer 26 is then formed. Body layer 26 is of p-type, and hence is referred to as p-body 26 hereinafter. In some embodiments, p-body 26 is formed by implanting a top portion of epitaxy layer 22 with a p-type impurity such as boron and/or indium, wherein a bottom portion of epitaxy layer 22 is not implanted, and remains to be of n-type. The p-type impurity concentration of p-body 26 may be between about $10^{15}/cm^3$ and about $10^{18}/cm^3$. The implantation of p-body 26 may include forming a pad oxide layer (not shown) by oxidizing a surface layer of epitaxy layer 22, implanting the p-type impurity through the pad oxide layer to form p-body 26, and then removing the pad oxide layer. In alternative embodiments, p-body 26 is formed by epitaxially growing a semiconductor layer (such as silicon layer) on epitaxy layer 22, and in-situ doping a p-type impurity into p-body 26 when the epitaxy proceeds.

Figure 1B:
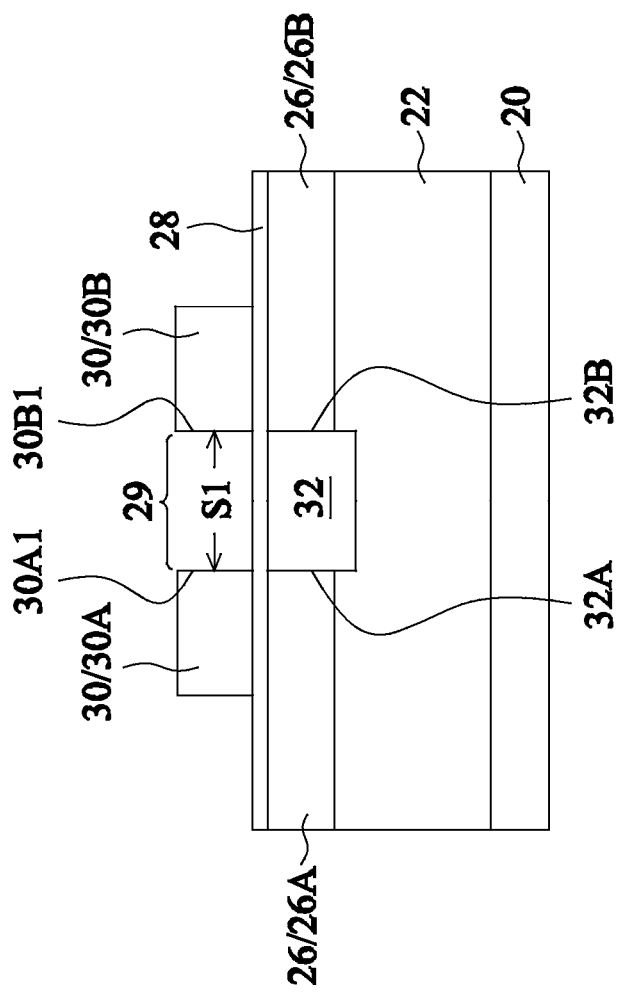

Next, as shown in FIG. 1B, gate oxide layer 28 is formed. In some embodiments, the formation process includes a thermal oxidation of a surface layer of p-body 26. Accordingly, gate oxide layer 28 comprises silicon oxide. In alternative embodiments, gate oxide layer 28 is formed through deposition. The corresponding gate oxide layer 28 may include silicon oxide, silicon nitride, silicon oxynitride, silicon carbide, combinations thereof, and multi-layers thereof.

FIG. 1B also illustrates the formation of gate electrodes 30 (including 30A and 30B). The formation process may include a blanket deposition of a conductive material, and then patterning the conductive material. In some embodiments, gate electrodes 30A and 30B comprise polysilicon, although other conductive materials such as metals, metal silicides, or the like, may also be used. Gate electrodes 30A and 30B are spaced apart from each other by space 29. Spacing S1 between gate electrodes 30A and 30B may be between about 100 nm and about 10 µm nm in some exemplary embodiments. It is appreciated that the values recited throughout the description are merely examples, and may be changed to different values.

Next, an implantation is performed to form n-type doped region 32. N-type doped region 32 is sometimes referred to as an N-type Junction Field Effect Transistor (n-JFET) region, since it functions as a part of a JFET. In the implantation, a photo resist (not shown) may be applied and then patterned, and space 29 between gate electrodes 30A and 30B is exposed, so that the implantation is performed through space 29. The implanted n-type impurity may include phosphorous, arsenic, or the like. At least portions of gate electrodes 30A and 30B may be used as an implantation mask. The implanted n-type impurity neutralizes the p-type impurity in the implanted portion of p-body 26, and converts the implanted portion to n-type. The resulting n-type doped region 32 penetrates through p-body 26, and has a bottom at least contacting, and may extend into, epitaxy layer 22. P-body 26 is thus separated into two portions, namely p-body 26A and p-body 26B. The impurity concentration of n-type doped region 32 may be between about $10^{15}/cm^3$ and about $10^{18}/cm^3$ in accordance with some embodiments. Interface 32A between n-type doped region 32 and p-body 26A is substantially aligned to edge 30A1 of gate electrode 30A, and interface 32B between n-type doped region 32 and p-body 26B is substantially aligned to edge 30B1 of gate electrode 30B. However, the interface may be also expended toward gate electrodes after the thermal treatment that is performed after implantation, due to the outwardly diffusion of implantations.

Figure 1C:
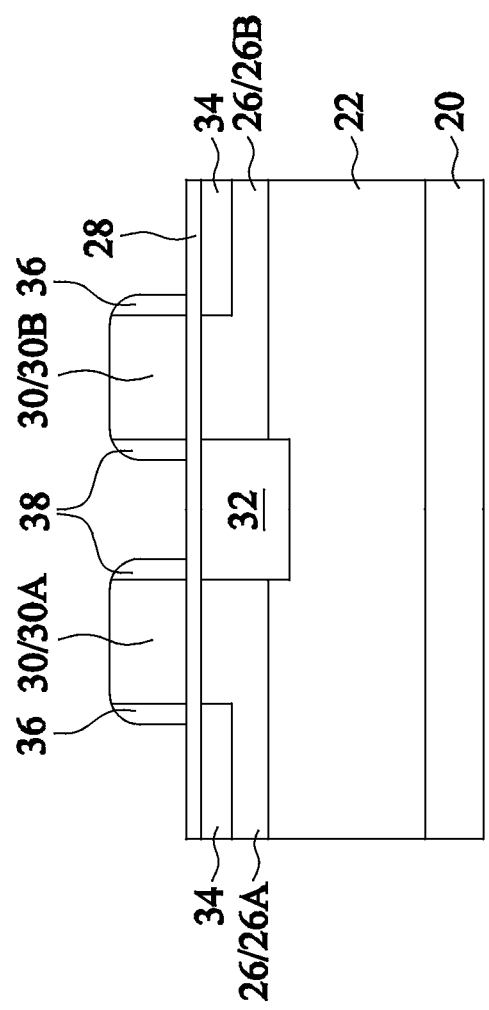

Referring to FIG. 1C, a further implantation is performed to form heavily doped n-type regions 34, which act as the source contact regions. N-type regions 34 may have an n-type impurity concentration between about $10^{19}/cm^3$ and about $10^{21}/cm^3$, for example. The bottom surfaces of n-type regions 34 are spaced apart from epitaxy layer 22 by portions of p-body 26. In a subsequent step, gate spacers 36 are formed on the sidewalls of gate electrodes 30A and 30B. The formation process may include depositing a dielectric layer, and then performing an anisotropic etching to remove the horizontal portions of the dielectric layer. The vertical portions of the dielectric layer on the sidewalls of gate electrodes 30A and 30B remain after the etching, and form gate spacers 36.

Figure 1D:
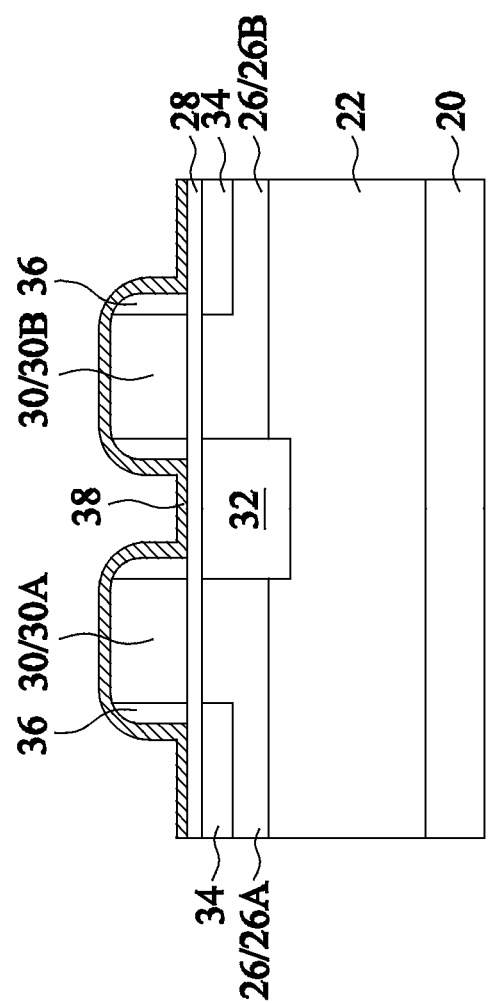

In FIG. 1D, dielectric layer 38 is formed over n-type regions 34, spacers 36, and gate electrodes 30A and 30B. In some embodiments, dielectric layer 38 are used as the etch stop layer in the formation of contact openings in subsequent steps, which contact openings are used for forming the contact plugs that are connected to gate electrodes 30A and 30B. Dielectric layer 38 may comprise an oxide, a nitride, an oxynitride, combinations thereof, and multi-layers thereof.

Figure 1E:
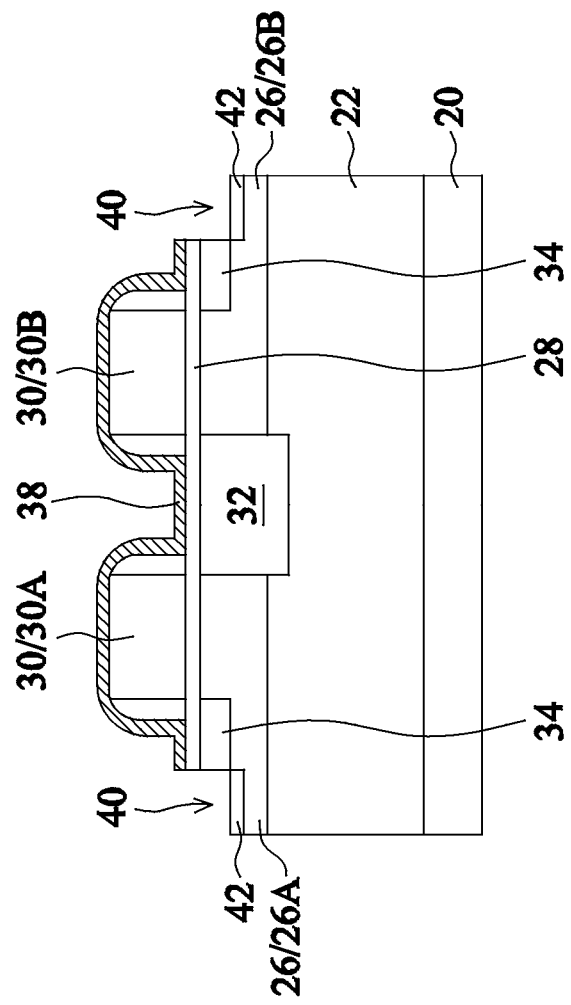

Next, referring to FIG. 1E, dielectric layer 38, gate dielectric layer 28, and portions of heavily doped n-type regions 34 are etched to form contact openings 40. After the contact opening formation, the sidewalls of heavily doped n-type regions 34 are exposed to contact openings 40, and the top surfaces of p-bodies 26A and 26B are also exposed. Next, a p-type impurity implantation is performed to form heavily doped p-type regions 42 in p-body regions 26. In some embodiments, the p-type impurity concentration in heavily doped p-type regions 42 is between about $10^{19}/cm^3$ and about $10^{21}/cm^3$. Heavily doped p-type regions 42 act as the pickup regions of p-bodies 26A and 26B.

Figure 1F:
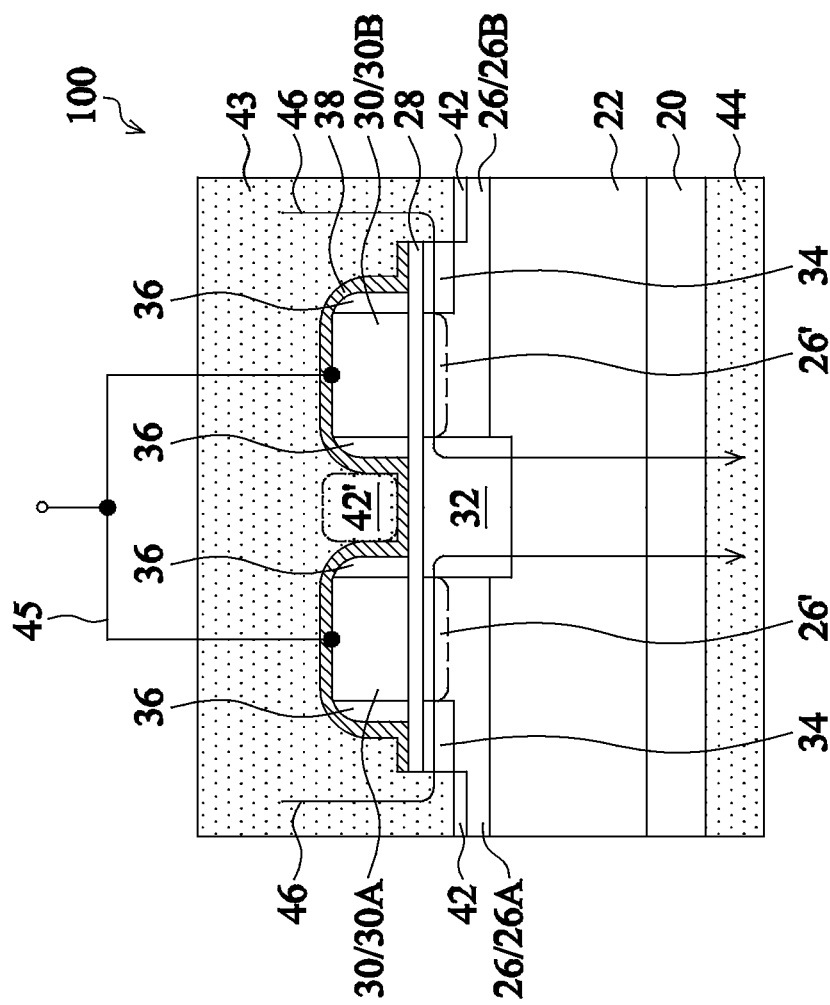

Referring to FIG. 1F, a conductive material is deposited to form source region 43. Source region 43 contacts the sidewalls of heavily doped n-type regions 34. Furthermore, a conductive material is deposited underneath heavily doped semiconductor region 20 to form drain region 44. Source regions 43 and drain region 44 are formed on the opposite sides of the respective wafer and chip. In some embodiments, source region 43 and drain region 44 are formed of a metal or a metal alloy such as aluminum, copper, tungsten, nickel, and/or the like. Vertical power MOSFET 52 is thus formed. Electrical connections 45 such as contact plugs, metal lines, and the like, are formed over, and connected to, gate electrodes 30A and 30B. Gate electrodes 30A and 30B are thus interconnected, and are at the same voltage level, and act as one gate.

An on-current of vertical power MOSFET 52 is schematically illustrated using curved lines 46, which pass through source region 43, heavily doped n-type regions 34, channel regions 26' in p-type bodies 26A and 26B, n-type doped region 32, epitaxy layer 22, semiconductor region 20, and reach drain region 44. It is appreciated that source region 43 comprises portion 42' extending into the space between gate electrodes 30A and 30B, and overlapping n-type doped region 32. Conductive portion 42' acts as a field plate that is connected to source region 43, and functions to reduce surface electrical fields in n-type doped region 32.

Figure 2A:
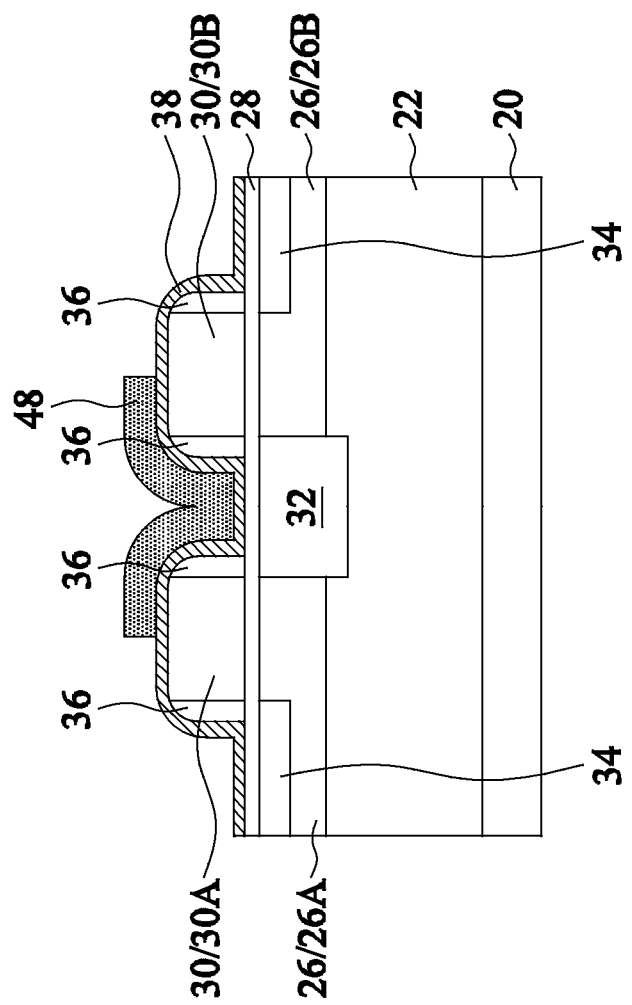
FIGS. 2A through 2C are cross-sectional views of intermediate stages in the manufacturing of a vertical power MOSFET in accordance with alternative embodiments.
Figure 2B:
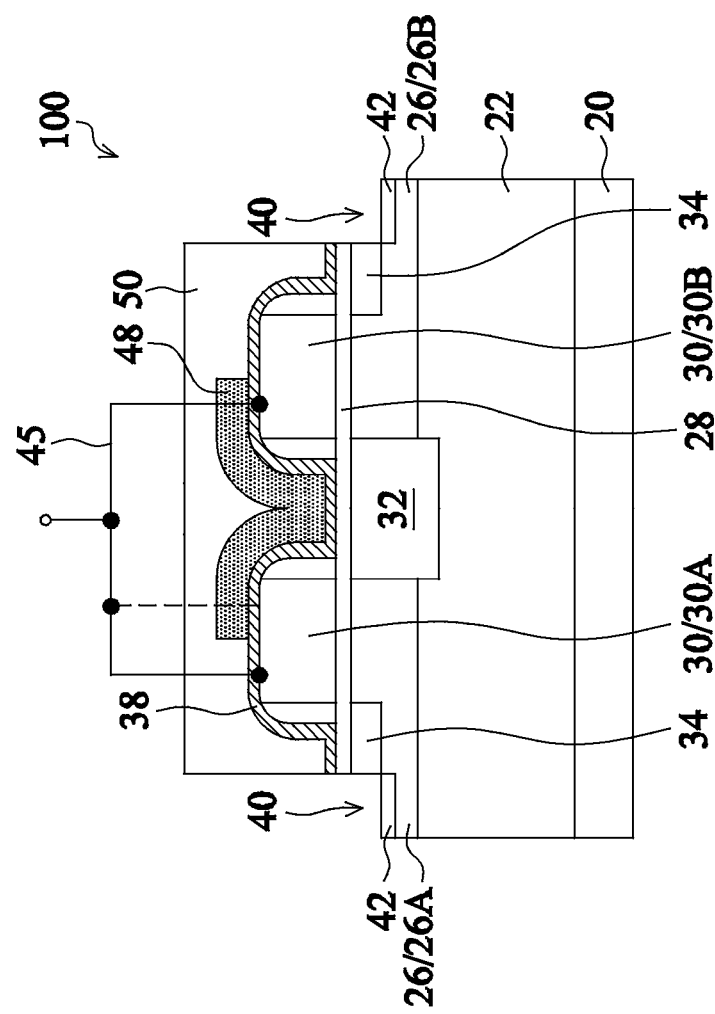
Figure 2C:
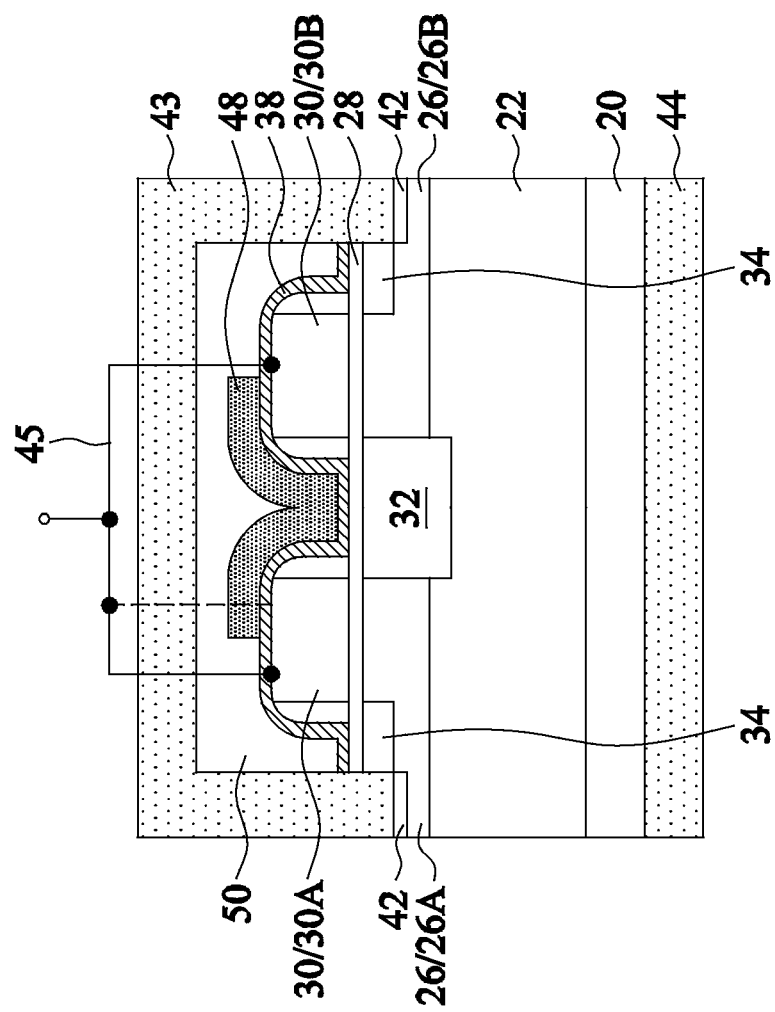

FIGS. 2A through 2C illustrate cross-sectional views of intermediate stages in the formation of a vertical power MOSFET in accordance with alternative embodiments. Unless specified otherwise, the materials and formation methods of the components in the embodiments in FIGS. 2A through 2C are essentially the same as the like components, which are denoted by like reference numerals in the embodiments shown in FIGS. 1A through 1F. The details of the like components shown in FIGS. 2A through 2C may thus be found in the discussion of the embodiment shown in FIGS. 1A through 1F.

The initial steps of these embodiments are essentially the same as shown in FIGS. 1A through 1D. Next, as shown in FIG. 2A, field plate 48 is formed. Field plate 48 is conductive, and may comprise polysilicon, a metal silicide, a metal, a metal alloy, or the like. Field plate 48 extends into the space between gate electrodes 30A and 30B, and overlaps n-type doped region 32. In some embodiments, field plate 48 extends over gate electrodes 30A and 30B, and overlaps a part of each of gate electrodes 30A and 30B. In alternative embodiments, field plate 48 does not extend over gate electrodes 30A and 30B. Field plate 48 functions to reduce the surface electrical field in n-type doped region 32. In some embodiments, field plate 48 is disconnected from the subsequently formed source region 43, and may be applied with a voltage different from the voltage of source region 43. In alternative embodiments, field plate 48 is connected to, and hence is at a same voltage level as, the subsequently formed source region 43.

Referring to FIG. 2B, Inter-Layer Dielectric (ILD) 50 is formed over the structure shown in FIG. 2A, and is over dielectric layer 38. ILD 50 may comprise Phospho-Silicate glass (PSG), Boro-Silicate Glass (BSG), Boron-Doped Phospho-Silicate Glass (BPSG), Tetra Ethyl Ortho Silicate (TEOS) oxide, or the like. ILD 50 may be formed as a blanket layer. Contact openings 40 are then formed by etching ILD 50, gate dielectric layer 28, and some portions of heavily doped n-type regions 34 to form contact openings 40. After the contact opening formation, the sidewalls of heavily doped n-type regions 34 are exposed, and the top surfaces of p-bodies 26A and 26B are also exposed.

Next, an implantation is performed to dope a p-type impurity through contact openings 40 and into p-bodies 26, so that heavily doped p-type regions 42 are formed in the surface regions of p-body 26. In a subsequent step, as shown in FIG. 2C, conductive materials are deposited to form source region 43 and drain region 44. Vertical Power MOSFET 52 is thus formed. The electrical connections 45, which are connected to gate electrodes 30A/30B and field plate 48 may be formed by forming contact plugs and metal lines. In some embodiments, field plate 48 is electrically coupled to, and at a same voltage as, source region 43. In alternative embodiments, field plate 48 is disconnected from source region 43, and is applied with a voltage separate from the voltage of source region 43.

In the embodiments, gate electrodes 30A and 30B do not overlap n-type region 32, which is electrically connected to drain region 44 through n-type epitaxy layer 22 and n-type region 20. Accordingly, the gate-to-drain capacitance is significantly reduced. Furthermore, since n-type region 32 is formed by implantation, and may be doped to a high impurity concentration, the resistance of n-type region 32 is reduced, and the drive current of vertical power MOSFET 52 is increased.

Although the embodiments shown in FIGS. 1A through 2C provide methods of forming n-type vertical power MOSFETs, one skilled in the art will realize that the provided teaching is readily available for the formation of p-type vertical power MOSFETs, with the conductivity types of the respective regions 20, 22, 26, 32, 34, and 42 inverted.

FIGS. 3A through 5F illustrate the process flows for integrating the formation of power MOSFET 52 with High Voltage (HV) N-type MOS (HVNMOS) devices, Low Voltage (LV) N-type MOS (LVNMOS) devices, LV P-type MOS (LVPMOS) devices, and High Voltage (HV) P-type MOS (HVPMOS) devices. Unless specified otherwise, the materials and formation methods of some of the components in these embodiments are essentially the same as the like components, which are denoted by like reference numerals in the embodiments shown in FIGS. 1A through 2C. The details regarding the formation processes and the materials of the components shown in FIGS. 3A through 5F may thus be found in the discussion of the embodiments shown in FIGS. 1 through 2C.

FIG. 3A illustrate devices regions 100, 200, 300, 400, and 500, which are a vertical power MOSFET region, an HVNMOS region, an LVNMOS region, an LVPMOS region, and an HVPMOS region, respectively. Referring to FIG. 3A, substrate 21 is provided. In accordance with some embodiments, substrate 21 is a p-type substrate, although it may also be an n-type substrate in accordance with alternative embodiments. N-type Buried Layer (NBL) 110 is formed at the top surface of substrate 21, for example, through an implantation. NBL 110 may be in device region 100, and does not extend into device regions 200, 300, 400, and 500. Next, an epitaxy is performed to form epitaxy layer 22 over substrate 21, wherein epitaxy layer 22 may be in-situ doped with an n-type impurity during the epitaxy. After the epitaxy, isolation regions 23 are formed to extend from the top surface of epitaxy layer 22 into epitaxy layer 22. Isolation regions 23 may be Shallow Trench Isolation (STI) regions, and hence are referred to as STI regions 23 throughout the description, although they may also be field oxides. STI regions 23 may define the active regions for device regions 100, 200, 300, 400, and 500.

Referring to FIG. 3B, gate oxide layer 28 is formed on the surface of epitaxy layer 22, and extends into device regions 100, 200, 300, 400, and 500. A plurality of implantations is performed to form a plurality of doped regions in epitaxy layer 22. In some embodiments, gate oxide layer 28 is formed before the implantation steps, wherein the implanted impurities penetrate through gate oxide layer 28 to form the implantation regions. In alternative embodiments, gate oxide layer 28 is formed after the implantation steps.

P-bodies 26 and 226 are formed simultaneously using the same lithography mask, which defines the patterns of the photo resist that is used as the implantation mask. Low Voltage Well (LVW) region 329, which may be a p-type region, is formed in device region 300. LVW region 329 may be configured to support the respective device to operate at operation voltages that are around 5V. P-type Doped Drain (PDD) region 531 is formed in device region 500. High Voltage N-Well (HVNW) regions 225, 325 and 525 are formed in device regions 200, 300/400, and 500, respectively. The symbol "300/400" indicates the combined region of devices region 300 and 400. P-body 226, LVW region 329, and PDD region 531 are formed inside HVNW regions 225, 325, and 525, respectively. The doping concentration of p-bodies 26 and 226 is the same as in the embodiments in FIGS. 1 through 2C. LVW region 329 may have a p-type doping concentration between about $10^{15}/cm^3$ and about $10^{18}/cm^3$. PDD region 531 is lightly doped, and may have a p-type doping concentration between about $10^{15}/cm^3$ and about $10^{18}/cm^3$.

Furthermore, deep p-well regions 227, 327, and 527 are formed in device regions 200, 300/400, and 500, respectively, and extend below HVNW regions 225, 325 and 525, respectively. HVNW regions 225, 325, and 525 and deep p-well regions 227, 327 and 527 may have doping concentrations between about $10^{15}/cm^3$ and about $10^{18}/cm^3$. The detailed formation processes, the respective photo resists, and the respective lithography masks for the plurality of implantations shown in FIG. 3B are not illustrated, and one skill in the art will realize the respective details with the teaching of the embodiments.

Figure 3C:
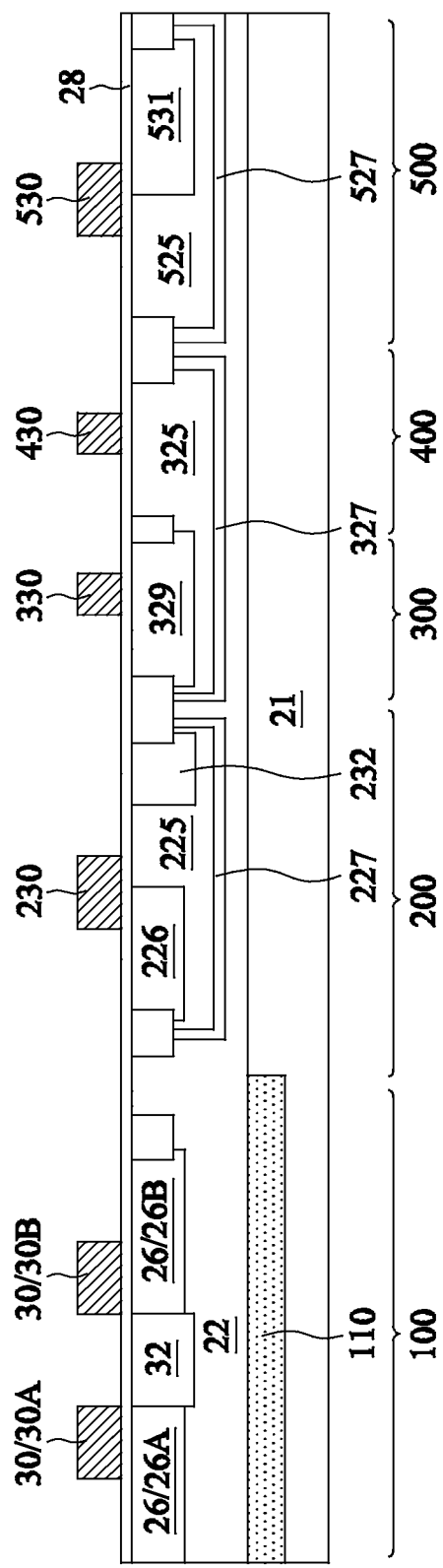
FIGS. 3A through 5F are cross-sectional views of intermediate stages in the integration of the formation of various MOS devices.

In FIG. 3C, gate electrodes 30 (including 30A and 30B), 230, 330, 430, and 530 are formed in device regions 100, 200, 300, 400, and 500, respectively, and over gate oxide layer 28. An implantation is then performed to form n-type doped region 32 that is located between gate electrodes 30A and 30B, wherein gate electrodes 30A and 30B act as parts of the implantation mask. P-body 26 is thus separated into p-bodies 26A and 26B by n-type doped region 32. At the same time n-type doped region 32 is formed, n-type region 232 is simultaneously formed in device region 200 by the same implantation. In some embodiments, a part of gate electrode 230 overlaps a part of p-body 226, and another part of gate electrode 230 is misaligned with p-body 226. Alternatively, the edge of p-body 226 is aligned to the edge of gate electrode 230. Furthermore, a part of gate electrode 530 overlaps a part of PPD region 531, and another part of gate electrode 230 is misaligned with PPD region 531. Alternatively, the edge of PDD region 531 is aligned to the edge of gate electrode 530.

Figure 3D:
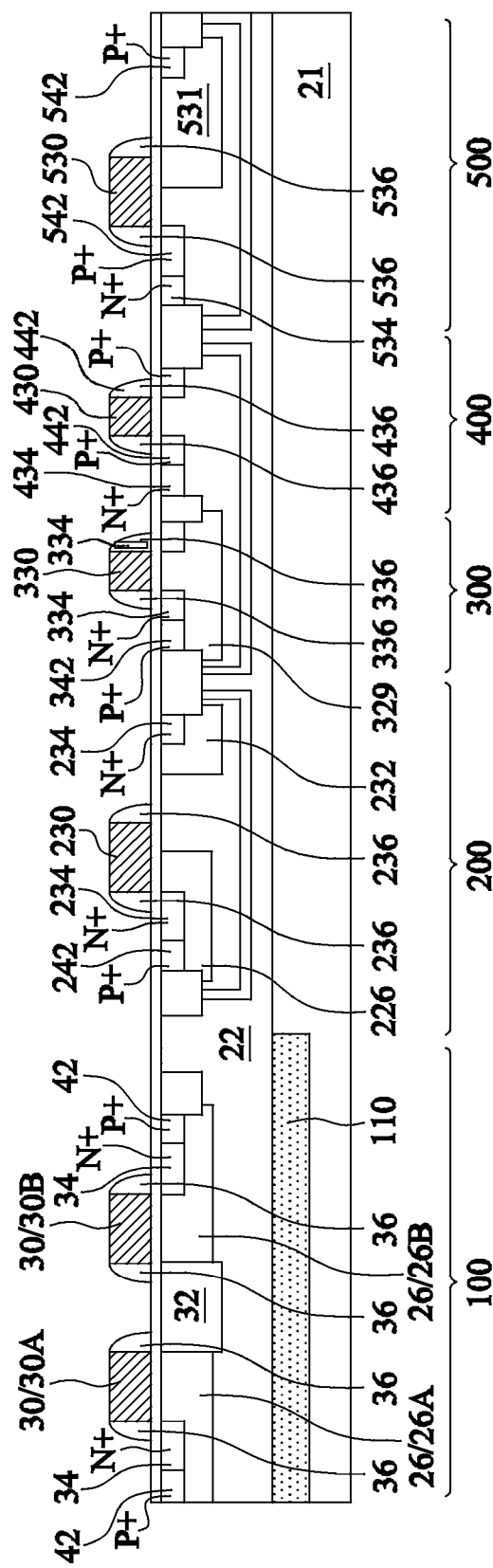

Referring to FIG. 3D, gate spacers 36, 236, 336, 436, and 536 are formed simultaneously, and on the sidewalls of the respective gate electrodes 30, 230, 330, 430, and 530. An implantation is then performed to implant epitaxy layer 22 in order to form heavily doped n-type regions (marked as N+ regions) 34, 234, 334, 434, and 534. An additional implantation is also performed to implant epitaxy layer 22 in order to form heavily doped p-type regions (marked as P+ regions) 42, 242, 342, 442, and 542.

Figure 3E:
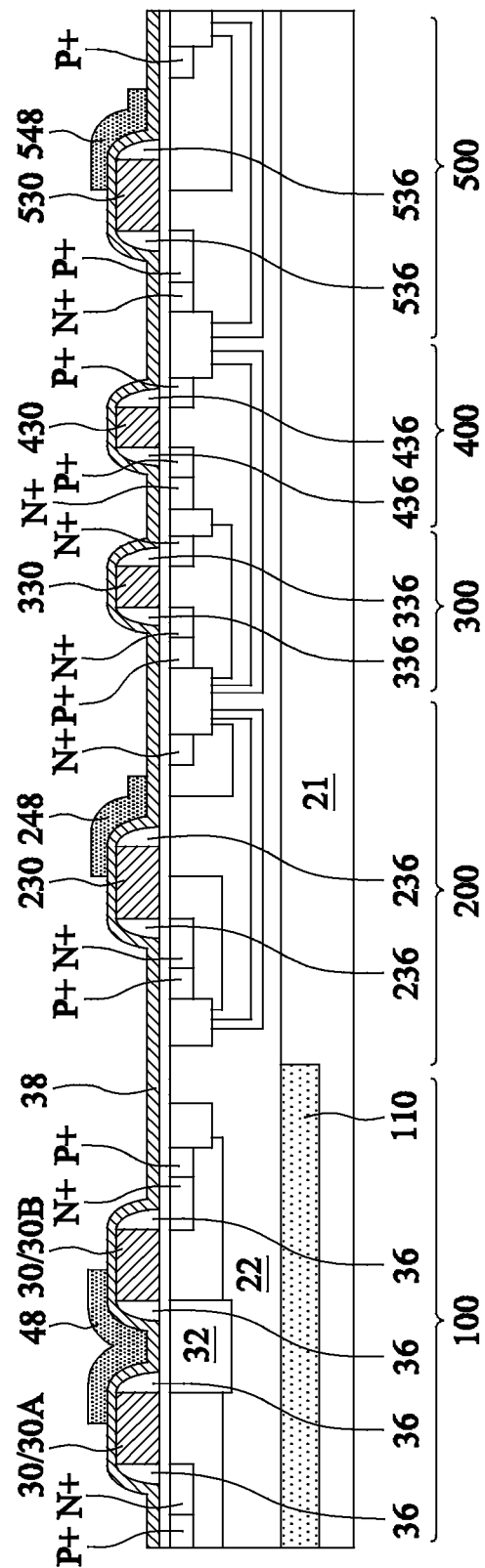

Next, as shown in FIG. 3E, dielectric layer 38 is formed as a blanket layer to cover the top surfaces of gate electrodes 30, 230, 330, 430, and 530, and over gate spacers 36, 236, 336, 436, and 536. Field plate 48 is formed over dielectric layer 38 and in device region 100. Simultaneously with the formation of field plate 48, field plates 248 and 548 are also formed in device regions 200 and 500, respectively. Field plate 248 includes a portion on the drain side of gate electrode 230, and may, or may not, include a portion overlapping gate electrode 230. Similarly, field plate 548 includes a portion on the drain side of gate electrode 530, and may, or may not, include a portion overlapping gate electrode 530.

Figure 3F:
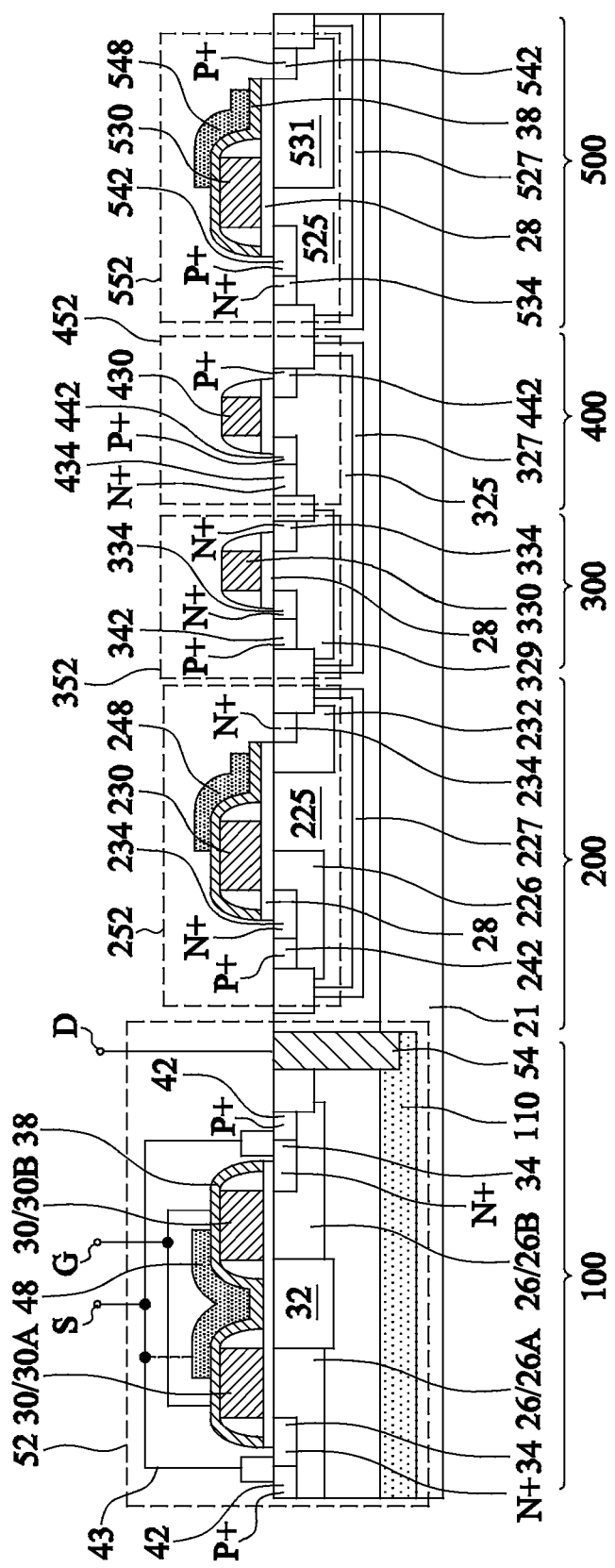

Referring to FIG. 3F, deep metal via 54 is formed to penetrate through epitaxy layer 22, and to contact NBL 110. The formation of deep metal via 54 may include etching epitaxy layer 22 to form an opening, and then filling the opening with a metallic material such as copper, aluminum, tungsten, or the like. Deep metal via 54 is electrically connected to NBL 110, which forms the drain region of vertical power MOSFET 52. A source region (symbolized using lines 43), which may be essentially the same as the source region 43 illustrated in FIG. 1F or FIG. 2C, may then be formed to connect to P+ regions 42 and N+ regions 34. The source, the drain, and the gate of vertical power MOSFET 52 are also denoted as S, D, and G, respectively.

In the resulting structure as in FIG. 3F, HVNMOS device 252 includes drain 234 (on the right side of gate electrode 230), which is spaced apart from gate electrode 230 by a portion of n-type doped region 232 and a part of HVNW region 225. Accordingly, with a low-doping concentration of HVNW region 225, HVNMOS device 252 may sustain a high drain voltage. Furthermore, field plate 248 help reduce the surface electrical field in HVNMOS device 252. Field plate 248 may be electrically coupled to source 234 (on the left side of gate electrode 230).

LVNMOS device 352 includes source and drain regions 334 in LVW region 329. LVPMOS device 452 includes source and drain regions 442 in HVNW region 325. HVPMOS device 552 includes drain 542 (on the right side of gate electrode 532), which is spaced apart from gate electrode 530 by a portion of PDD region 531. Accordingly, HVPMOS device 552 may sustain a high drain voltage. Furthermore, field plate 548 help reduce the surface electrical field in HVPMOS device 552. Field plate 548 may be electrically coupled to source 542 (on the left side of gate electrode 530).

In the above-discussed process flow, at the same time various components of vertical power MOSFET 52 is formed, the components of HVNMOS device 252, LVNMOS device 352, LVPMOS device 452, and HVPMOS device 552 are also formed. By forming the device components such as the implanted regions of MOS devices 52, 152, 252, 352, 452, and 552 simultaneously, the lithography masks and the respective process steps may be shared, and the manufacturing cost may be saved.

FIGS. 4A through 4F illustrate the cross-sectional views of intermediate stages in the integration of HVNMOS device 252, LVNMOS device 352, LVPMOS device 452, and HVPMOS device 552 with the formation of vertical power MOSFET 52 in accordance with alternative embodiments. These embodiments are similar to the embodiments in FIGS. 3A through 3F, except that instead of forming n-type epitaxy layer 22, a p-type epitaxy layer 22' is formed, and HVNW regions are formed in p-type epitaxy layer 22'. Devices 52, 252, 352, 452, and 552 are then formed on the HVNW regions.

Figure 4A:
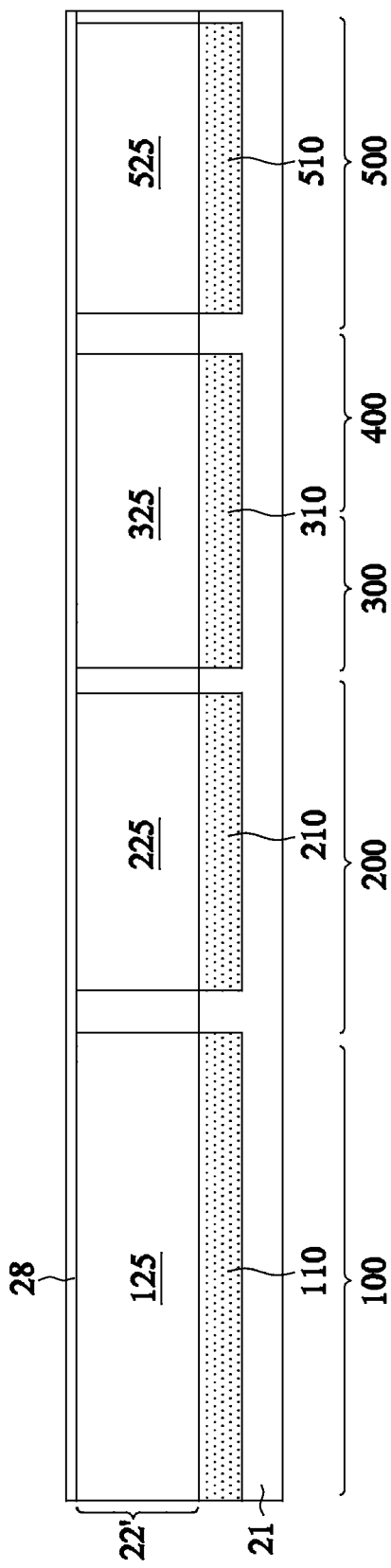

Referring to FIG. 4A, substrate 21 is provided, which may be a p-type substrate. NBLs 110, 210, 310, and 510 are formed in device regions 100, 200, 300/400, and 500 by implanting substrate 21. Next, epitaxy layer 22' is formed, wherein a p-type impurity is in-situ doped when epitaxy layer 22' is formed. STI regions 23 are then formed, and extend from the top surface into epitaxy layer 22'. Furthermore, HVNW regions 125, 225, 325, and 525 are formed in device regions 100, 200, 300/400, and 500, respectively, through the implantation of an n-type impurity. HVNW regions 125, 225, 325, and 525 may extend from the top surface to the bottom surface of epitaxy layer 22', and may be joined to the underlying NBLs 110, 210, 310, and 510, respectively. Gate oxide layer 28 is also formed. In some embodiments, gate oxide layer 28 is formed before the implantation steps, wherein the implanted impurities penetrate through gate oxide layer 28 to form the implantation regions. In alternative embodiments, gate oxide layer 28 is formed after the implantation steps.

Figure 4B:
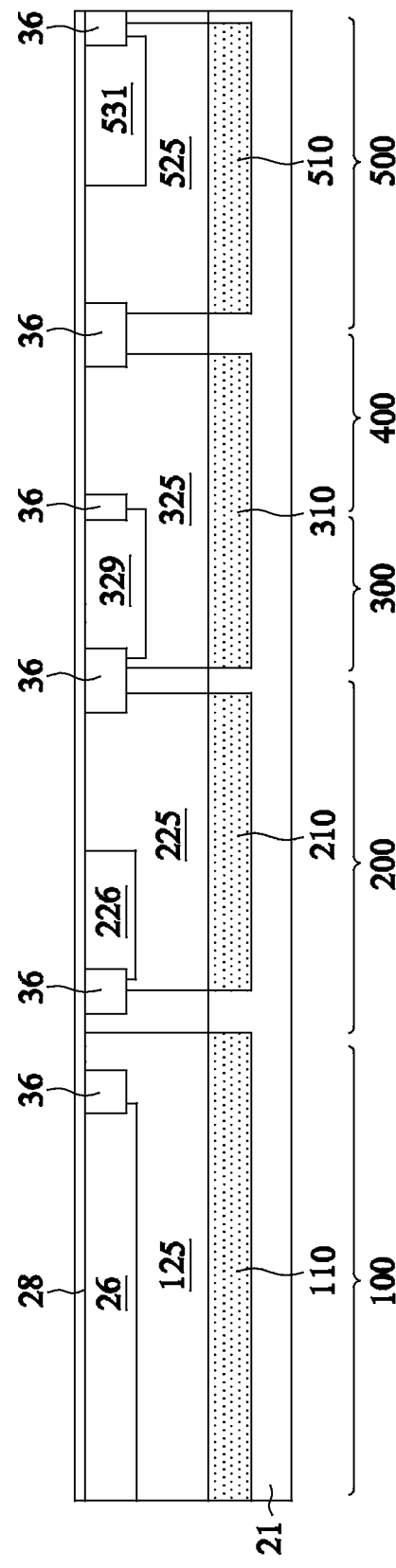
Figure 4C:
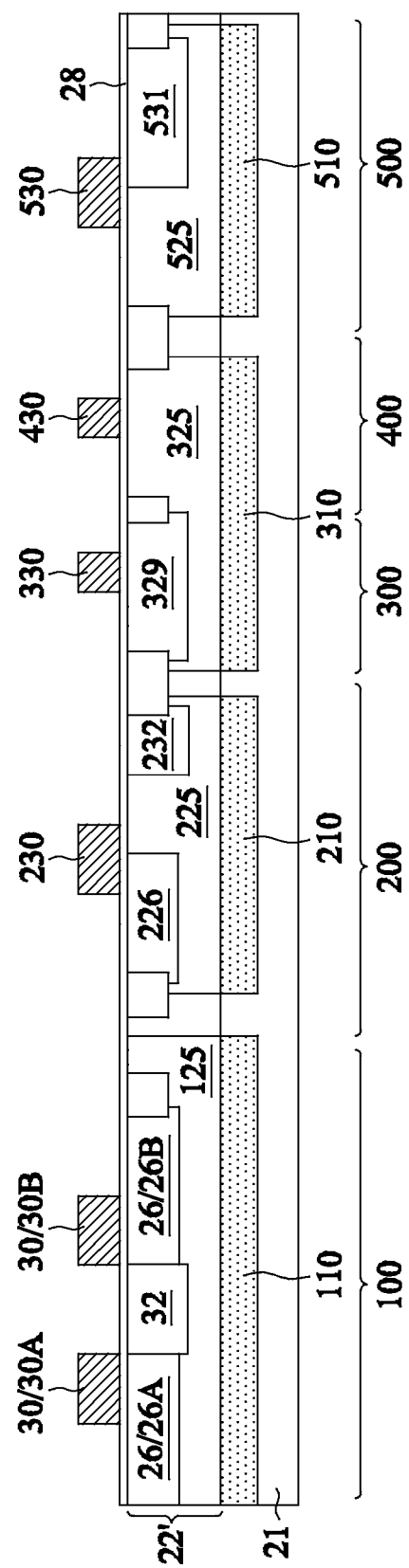
Figure 4D:
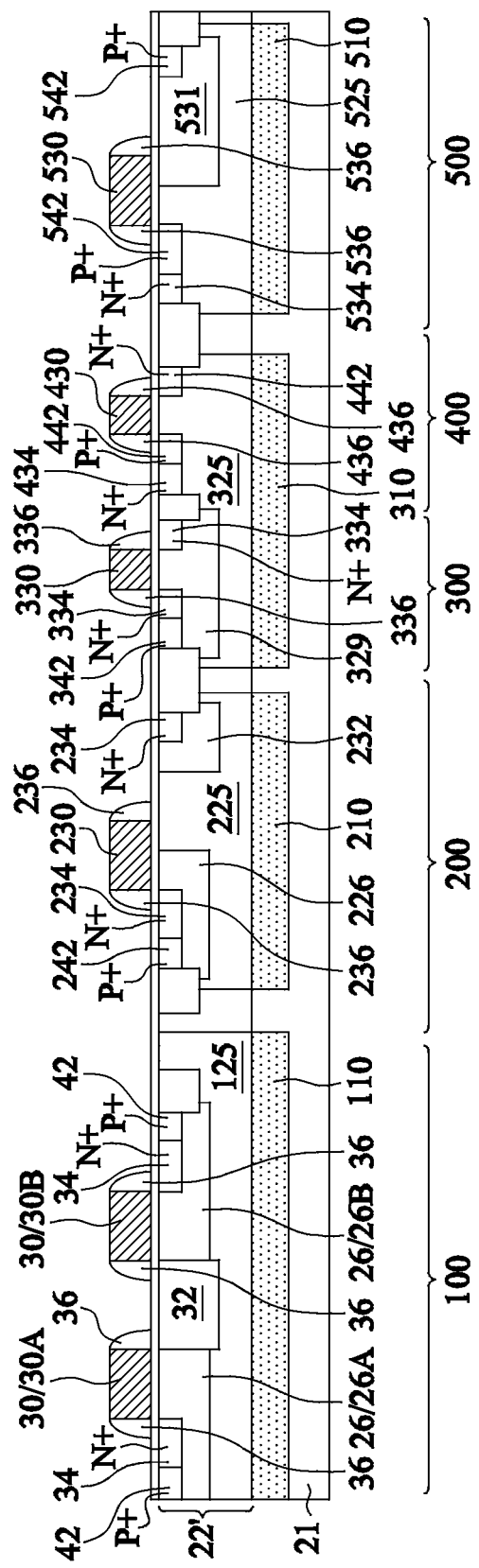

In FIG. 4B, p-bodies 26 and 226 are formed through an implantation. Furthermore, LVW region 329 and PDD region 531 are formed by implantations. The subsequent process steps in FIGS. 4C through 4F are essentially the same as shown in FIGS. 3C through 3F. The details of FIGS. 4C through 4F may thus be found in the discussion of FIGS. 3C through 3F, and a brief process flow is discussed as follows. In FIG. 4C, gate electrodes 30, 230, 330, 430, and 530 are formed, followed by the formation of n-type doped regions 32 and 332. P-body 26 in FIG. 4B is thus separated into p-bodies 26A and 26B. FIG. 4D illustrates the formation of gate spacers 36, 236, 336, 436, and 536. After the formation of the gate spacers, N+ regions 34, 234, 334, 434, and 534, and P+ regions 42, 242, 342, 442, and 542 are formed by implantations.

Figure 4E:
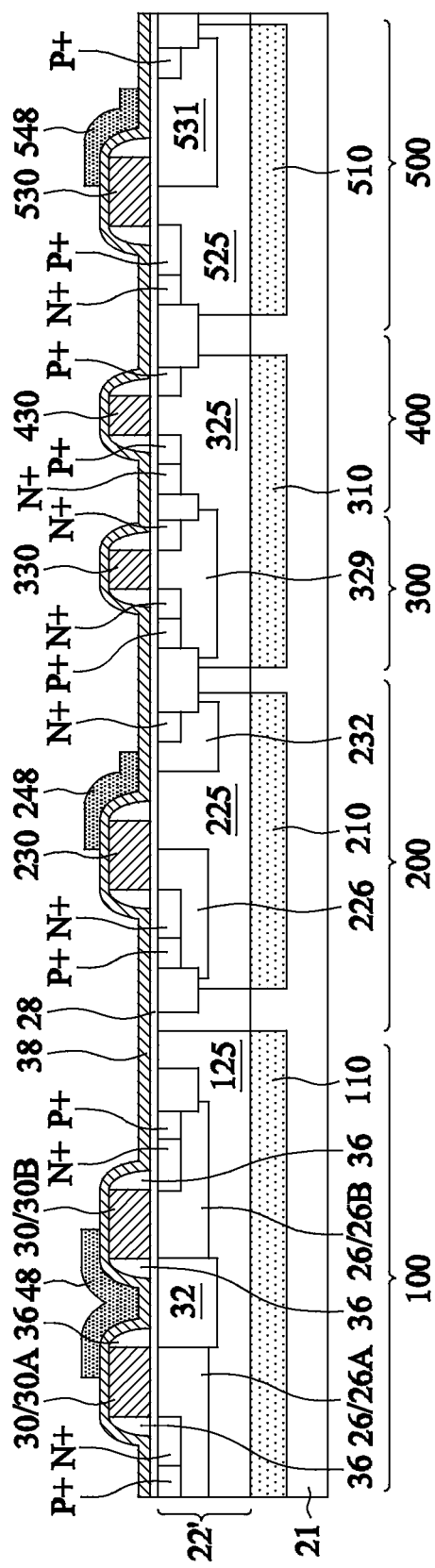
Figure 4F:
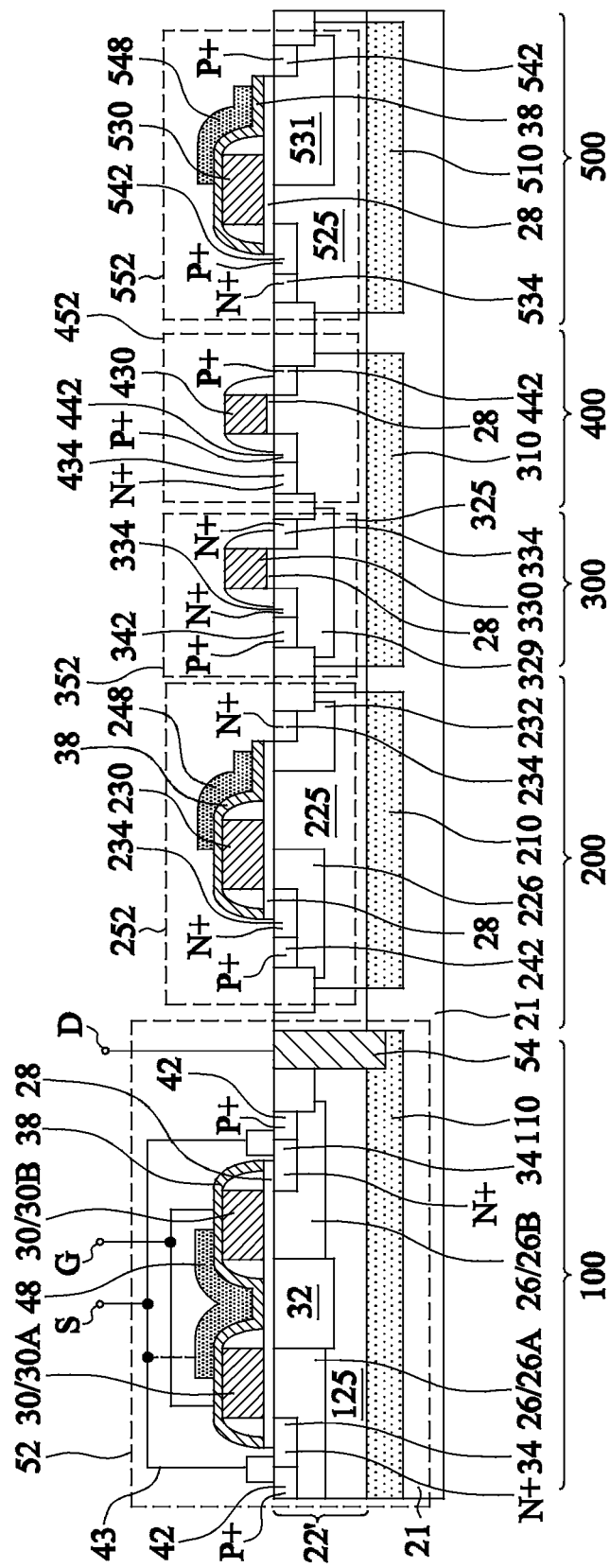

In FIG. 4E, dielectric layer 38 is formed, followed by the formation of field plates 48, 248, and 548. In FIG. 4F, metal deep via 54 is formed, and the electrical connections to vertical power MOSFET 52 are formed, which electrical connections are marked as source (S), drain (D), and gate (G).

FIGS. 5A through 5F illustrate the cross-sectional views of intermediate stages in the integration of HVNMOS device 252, LVNMOS device 352, LVPMOS device 452, and HVPMOS device 552 with the formation of vertical power MOSFET 52 in accordance with alternative embodiments. These embodiments are similar to the embodiments in FIGS. 3A through 4F, except that the electrical connections to vertical power device 52 are formed on the opposite sides of the respective substrate 21', which is of n-type in these embodiments.

Figure 5A:
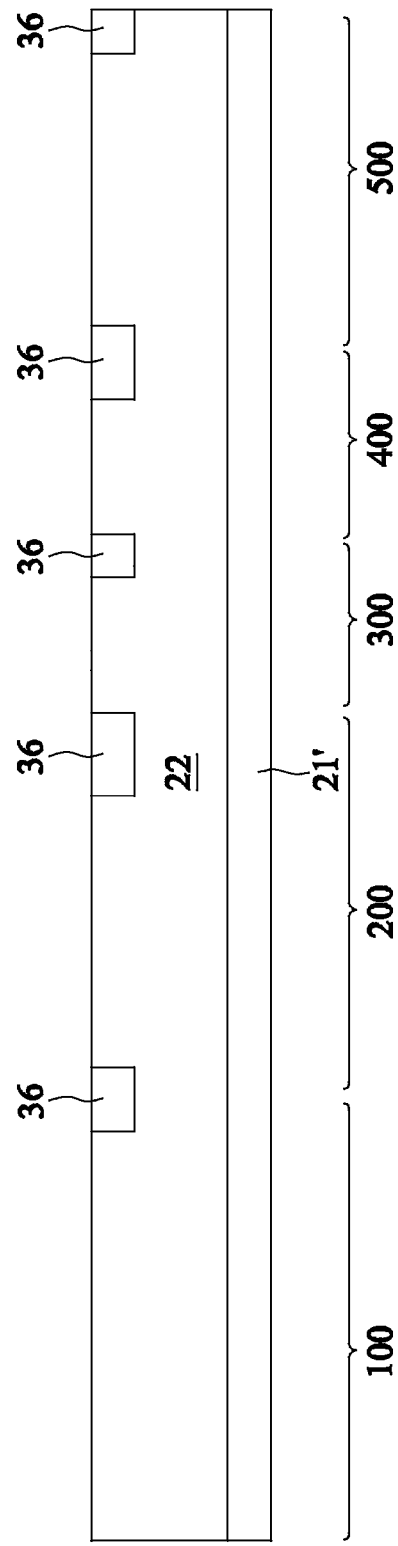

Referring to FIG. 5A, N+ substrate 21' is provided. N+ substrate 21' has a high n-type impurity concentration, which may be between about $10^{19}/cm^3$ and about $10^{21}/cm^3$, for example. N-type epitaxy layer 22 is epitaxially grown on N+ substrate 21'. Next, STI regions 23 are formed, and extend from the top surface into epitaxy layer 22.

Figure 5B:
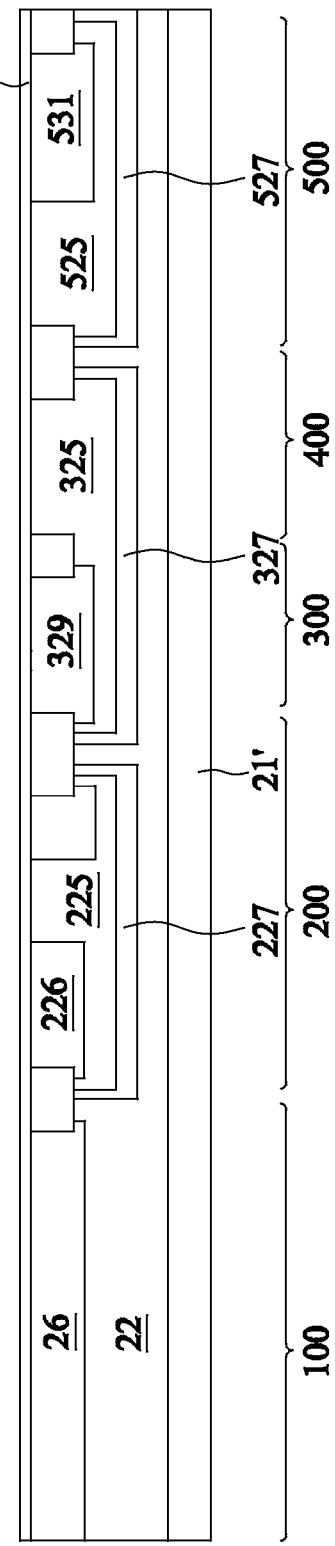

In subsequent steps, as shown in FIG. 5B, gate oxide layer 28 is also formed over epitaxy layer 22, and p-bodies 26 and 226 are formed by an implantation. Furthermore, LVW region 329 and PDD region 531 are formed by implantations. Furthermore, HVNW regions 225, 325, and 525 are formed in device regions 200, 300/400, and 500, respectively, through the implantation of an n-type impurity. HVNW regions 225, 325, and 525 may extend partially into epitaxy layer 22, and are spaced apart from N+ substrate 21' by portions of epitaxy layer 22. In some embodiments, gate oxide layer 28 is formed before the implantation steps. In alternative embodiments, gate oxide layer 28 is formed after the implantation steps. Deep p-well regions 227, 327, and 527 are also formed.

Figure 5C:
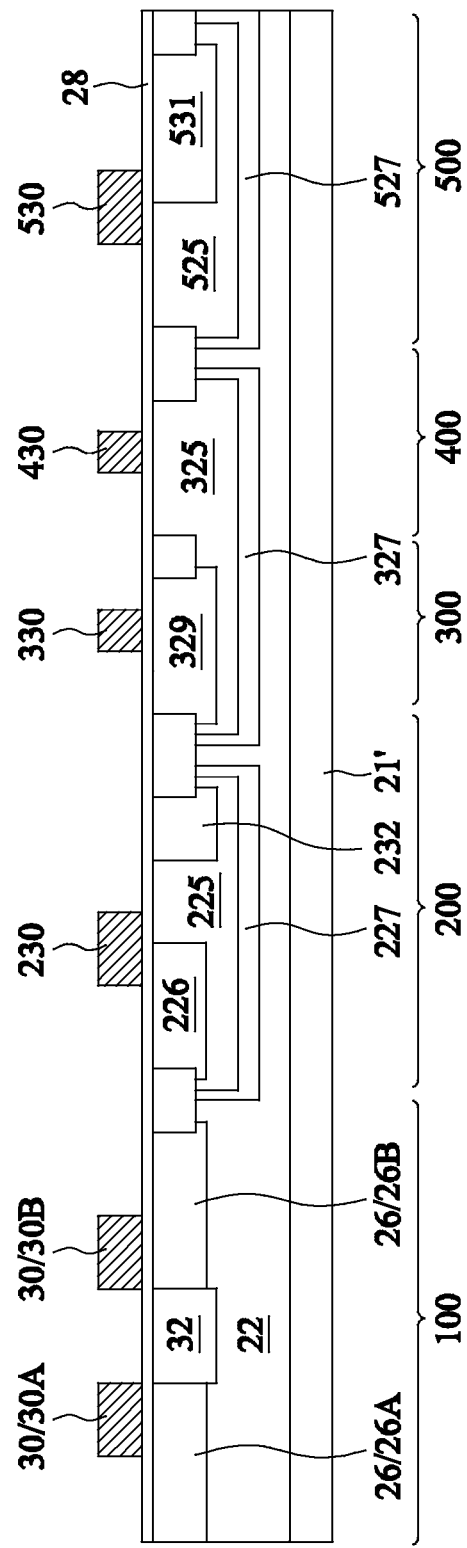
Figure 5D:
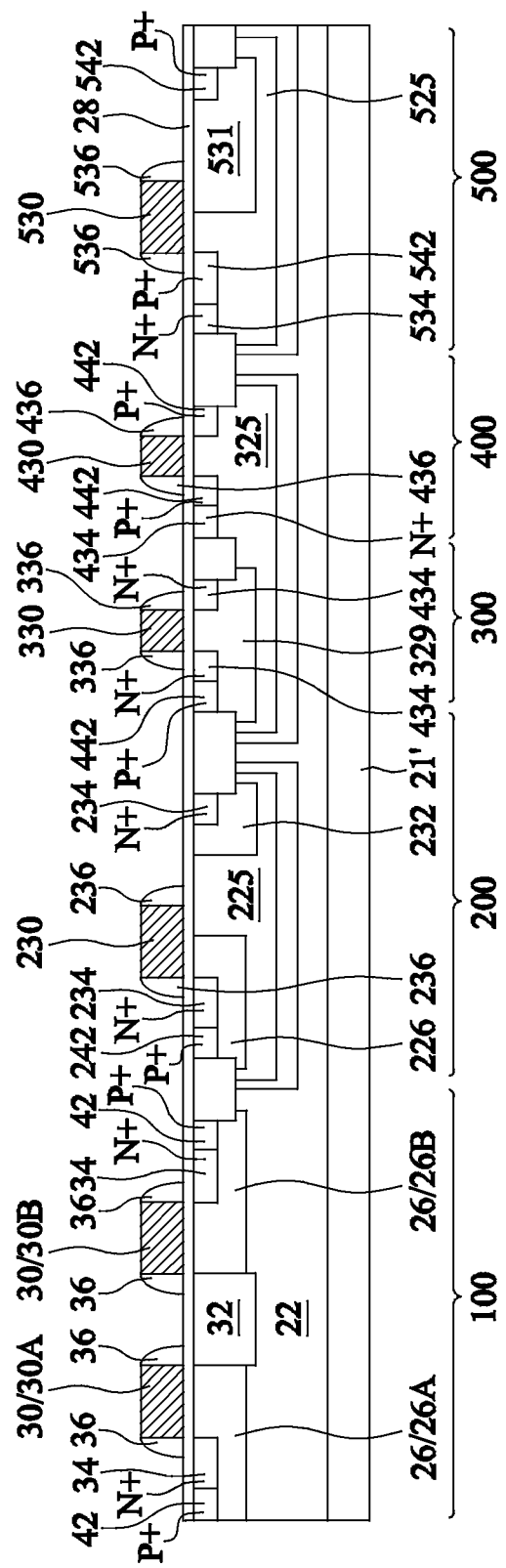
Figure 5E:
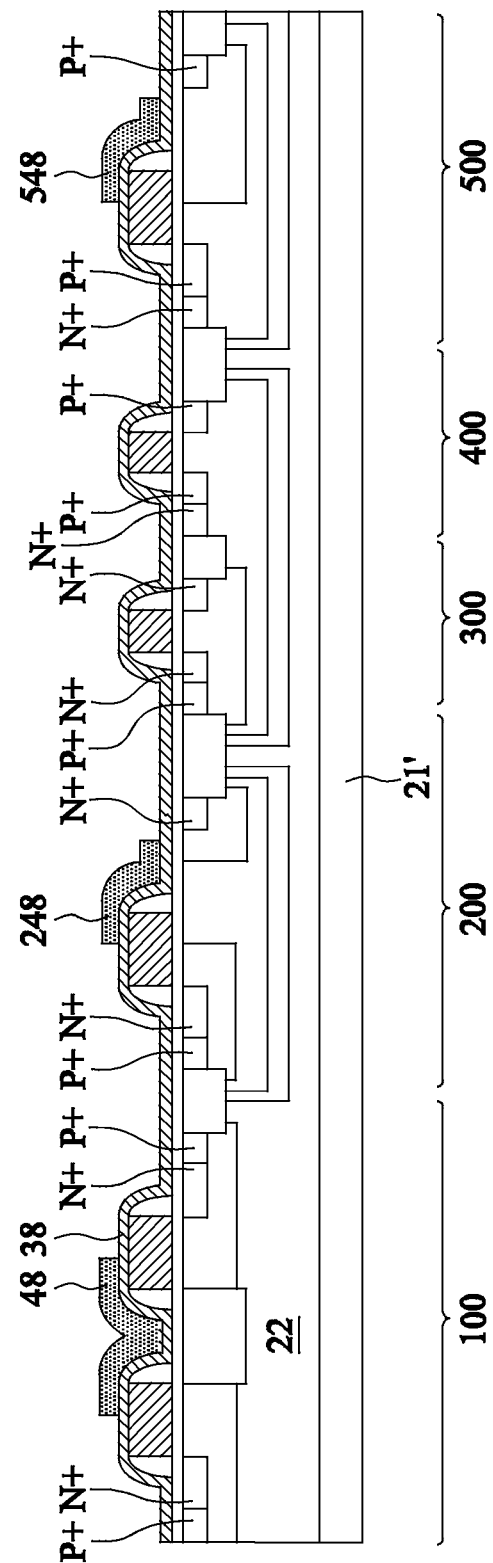
Figure 5F:
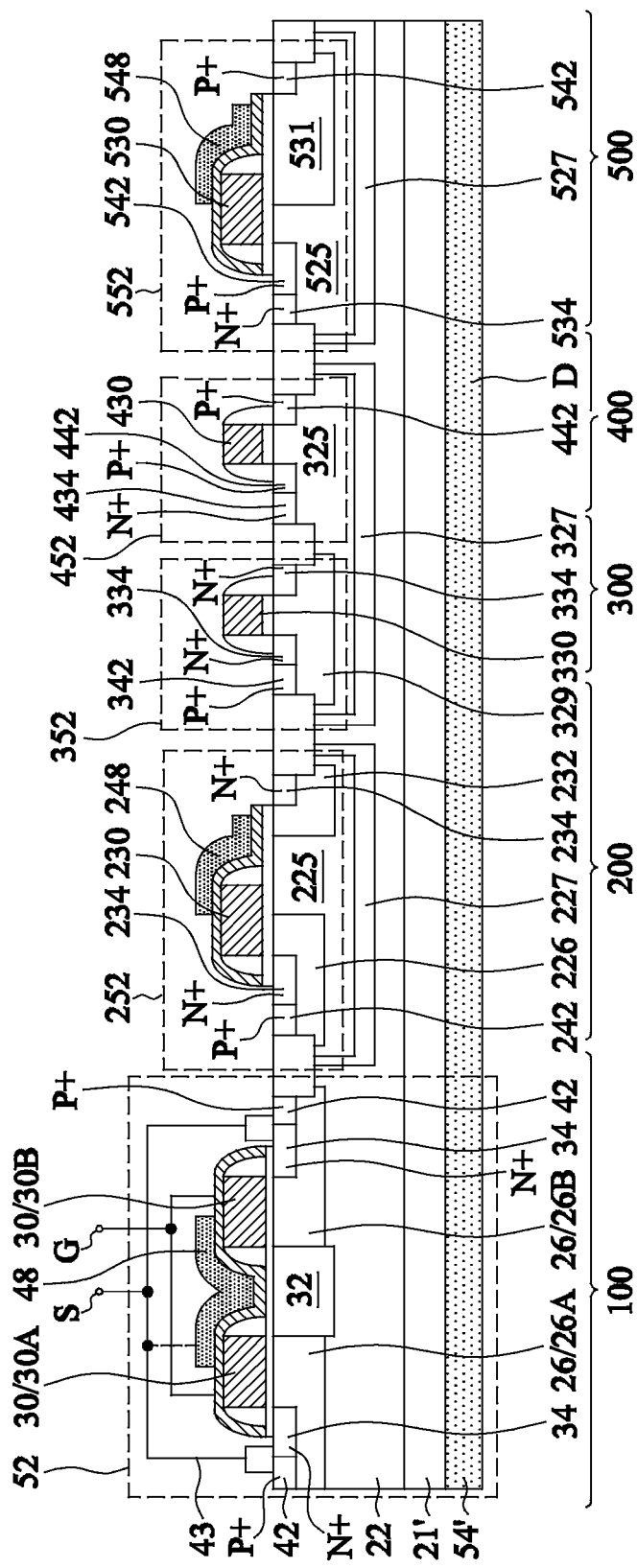

The subsequent process steps in FIGS. 5C through 5E are essentially the same as shown in FIGS. 3C through 3E. The details of FIGS. 5C through 5E may thus be found in the discussion of FIGS. 3C through 3E. A brief process flow is discussed as follows. In FIG. 5C, gate electrodes 30, 230, 330, 430, and 530 are formed, followed by the formation of n-type doped regions 32 and 332. P-body 26 in FIG. 5B is thus separated into p-bodies 26A and 26B as in FIG. 5C. FIG. 5D illustrates the formation of gate spacers 36, 236, 336, 436, and 536. After the formation of the gate spacers, N+ regions 34, 234, 334, 434, and 534, and P+ regions 42, 242, 342, 442, and 542 are formed by implantations.

In FIG. 5E, dielectric layer 38 is formed, followed by the formation of field plates 48, 248, and 548. Next, in FIG. 5F, metal plate 54' is deposited on, and may be in physical contact with, N+ substrate 21'. Metal plate 54' and N+ substrate 21' act as the drain of vertical power MOSFET 52. Accordingly, the source and drain connections of vertical power MOSFET 52 are on the opposite sides of the respective substrate 21'. By forming the source and drain connections on opposite sides, in subsequent packaging processes, the vertical power MOSFET 52 may be easily stacked with other devices.

In FIGS. 3A through 5F, the formation of various MOS devices, which are in different device regions and having different functions, are integrated. The formation of the various MOS devices may share same lithography masks. Structurally, the components of the MOS devices that are formed simultaneously may have a same type of impurity, a same depth, or the like. By sharing the lithography masks and the formation steps, the manufacturing cost is saved.

In accordance with embodiments, a device includes a semiconductor layer of a first conductivity type, and a first and a second body region over the semiconductor layer, wherein the first and the second body regions are of a second conductivity type opposite the first conductivity type. A doped semiconductor region of the first conductivity type is disposed between and contacting the first and the second body regions. A gate dielectric layer is disposed over the first and the second body regions and the doped semiconductor region. A first and a second gate electrode are disposed over the gate dielectric layer, and overlapping the first and the second body regions, respectively. The first and the second gate electrodes are physically separated from each other by a space, and are electrically interconnected. The space between the first and the second gate electrodes overlaps the doped semiconductor region. The device further includes a MOS containing device at a surface of the semiconductor layer, wherein the MOS containing device is selected from the group consisting essentially of an HVNMOS device, an LVNMOS device, an LVPMOS device, an HVPMOS device, and combinations thereof.

In accordance with other embodiments, a device includes a semiconductor layer of a first conductivity type, and a vertical power MOSFET. The vertical power MOSFET includes a first and a second body region of a second conductivity type opposite the first conductivity type, and a doped semiconductor region of the first conductivity type between the first and the second body regions. The bottoms of the doped semiconductor region and the first and the second body regions are in contact with top surfaces of the semiconductor layer. A gate dielectric layer is over the first and the second body regions and the doped semiconductor region. A first and a second gate electrode are over the gate dielectric layer, and overlapping the first and the second body regions, respectively. The first and the second gate electrodes are physically separated from each other by a space, and are electrically interconnected. A source region includes portions over the first and the second body regions. The vertical power MOSFET further includes drain region is underlying the semiconductor layer. A high voltage MOS device is overlying the semiconductor layer.

In accordance with yet other embodiments, a method includes epitaxially growing an epitaxy semiconductor layer of a first conductivity type, and forming a semiconductor body layer over the epitaxy semiconductor layer. The semiconductor body layer is of a second conductivity type opposite the first conductivity type. A gate dielectric layer is formed over the semiconductor body layer. A first and a second gate electrode are formed over the gate dielectric layer, wherein the first and the second gate electrodes are spaced apart from each other by a space. A portion of the semiconductor body layer is implanted to form a doped semiconductor region of the first conductivity type, wherein the doped semiconductor region is overlapped by the space. The doped semiconductor region extends to contact the epitaxy semiconductor layer. A source region is over the semiconductor body layer. A drain region is underlying the epitaxy semiconductor layer. A high voltage MOS device is further formed at a surface of the epitaxy semiconductor layer.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method comprising:
  forming a vertical power Metal-Oxide-Semiconductor Field Effect Transistor (MOSFET) comprising:
    forming a gate dielectric layer over a body layer, wherein the body layer extends into a semiconductor layer, with the semiconductor layer being of a first conductivity type, and the body layer being of a second conductivity type opposite to the first conductivity type;
    forming a first gate electrode and a second gate electrode over the gate dielectric layer, wherein the first and the second gate electrodes are spaced apart from each other by a space;

implanting a portion of the body layer to form a doped semiconductor region of the first conductivity type, wherein the doped semiconductor region is overlapped by the space;

forming a dielectric layer covering the first gate electrode and the second gate electrode;

forming a first field plate over the dielectric layer;

forming a source region, wherein a portion of the source region overlaps the doped semiconductor region;

forming an inter-layer dielectric between the first field plate and the source region; and forming a drain region underlying the semiconductor layer; and forming a Metal-Oxide-Semiconductor (MOS) containing device at a surface of the semiconductor layer, wherein the MOS containing device is selected from the group consisting essentially of a High Voltage (HV)N-type MOS (HVNMOS) device, a Low Voltage (LV)N-type MOS (LVNMOS) device, an LV P-type MOS (LVPMOS) device, an HV P-type MOS (HVPMOS) device, and combinations thereof, wherein the forming the MOS containing device comprises:

when the first gate electrode and the second gate electrode are formed, simultaneously forming a third gate electrode for the MOS containing device; and when the first field plate is formed, simultaneously forming a second field plate for the MOS containing device, with the second field plate having a portion overlapping the third gate electrode, and a portion level with the third gate electrode.

2. The method of claim 1, wherein the gate dielectric layer extends into the space, and the implanting is performed with an implanted impurity penetrating through a portion of the gate dielectric layer in the space.

3. The method of claim 1 further comprising:
implanting the body layer to form heavily doped regions on opposite sides of a combined region comprising the first gate electrode and the second gate electrode; and
etching portions of the body layer to expose sidewalls of the heavily doped regions.

4. The method of claim 3, wherein the source region comprises a metal, and the source region is in contact with sidewalls of the heavily doped regions.

5. The method of claim 1, wherein the forming the vertical power MOSFET comprises implanting a top portion of the semiconductor layer to convert the top portion to the body layer, and the forming the MOS containing device comprising, when the body layer is formed, simultaneously implanting an additional top portion of the semiconductor layer to form a doped region in a high-voltage well region of the MOS containing device.

6. The method of claim 1, wherein the source region comprises a portion filled into the space, with the portion level with the first gate electrode and the second gate electrode.

7. The method of claim 1, wherein the first field plate comprises a portion extending into the space and level with the first gate electrode and the second gate electrode.

8. The method of claim 1, wherein the doped semiconductor region penetrates through the body layer to contact the semiconductor layer.

9. A method comprising:
forming a vertical power Metal-Oxide-Semiconductor Field Effect Transistor (MOSFET) comprising:
epitaxially growing an epitaxy semiconductor layer of a first conductivity type;
forming a semiconductor body layer extending into the epitaxy semiconductor layer, wherein the semiconductor body layer is of a second conductivity type opposite the first conductivity type;

forming a gate dielectric layer over the semiconductor body layer;

forming a first and a second gate electrode over the gate dielectric layer, wherein the first and the second gate electrodes are spaced apart from each other by a space;

implanting a portion of the semiconductor body layer to form a doped semiconductor region of the first conductivity type, wherein the doped semiconductor region is overlapped by the space, and wherein the doped semiconductor region extends to contact the epitaxy semiconductor layer;

forming a dielectric layer over the first and the second gate electrodes;

forming a first conductive field plate over the dielectric layer, wherein the first conductive field plate extends into the space between the first and the second gate electrodes;

forming a source region over the semiconductor body layer; and forming a drain region underlying the epitaxy semiconductor layer; and forming a high voltage Metal-Oxide-Semiconductor (MOS) device at a surface of the epitaxy semiconductor layer, wherein the forming the high voltage MOS device comprises forming a second conductive field plate on a drain side of a gate electrode of the high voltage MOS device, and the first and the second conductive field plates are formed simultaneously.

10. The method of claim 9, wherein the forming the high voltage MOS device comprises forming an additional semiconductor body layer over the epitaxy semiconductor layer, wherein the semiconductor body layer and the additional semiconductor body layer are formed simultaneously in a same process step.

11. The method of claim 9, wherein the implanting the portion of the semiconductor body layer is performed using the first and the second gate electrodes as an implantation mask.

12. The method of claim 9 further comprising, when the semiconductor body layer is formed, simultaneously forming an additional body layer for the high voltage MOS device.

13. The method of claim 9, wherein the dielectric layer comprises:
a first portion directly over a top surface of the first gate electrode;
a second portion directly over a top surface of the second gate electrode; and
a third portion in the space, wherein the third portion connects the first portion to the second portion.

14. The method of claim 9, wherein the source region and the first conductive field plate is physically separated from the source region by an inter-layer dielectric.

15. A method comprising:
forming a vertical power Metal-Oxide-Semiconductor Field Effect Transistor (MOSFET) comprising:
forming a gate dielectric layer over a body layer, wherein the body layer extends into a semiconductor layer, with the semiconductor layer being of a first conductivity type, and the body layer being of a second conductivity type opposite to the first conductivity type;

forming a first gate electrode and a second gate electrode over the gate dielectric layer, wherein the first and the second gate electrodes are spaced apart from each other by a space, with an intermediate portion of the gate dielectric layer being in the space;

implanting a portion of the body layer underlying the intermediate portion of the gate dielectric layer to form a doped semiconductor region of the first conductivity type, wherein the doped semiconductor region is implanted to a level lower than a bottom of the body layer;

implanting an additional portion of the body layer to form a heavily doped region shallower than the body layer and the doped semiconductor region, with the heavily doped region being on an opposite side of the first gate electrode than the doped semiconductor region;

forming a source region, wherein a portion of the source region overlaps the doped semiconductor region and the intermediate portion of the gate dielectric layer, and the source region contacts the heavily doped region; and forming a drain region underlying the semiconductor layer; and forming a high voltage Metal-Oxide-Semiconductor (MOS) device at a surface of the semiconductor layer comprising:

when the doped semiconductor region is formed, simultaneously implanting an additional portion of the semiconductor layer to form an additional doped region for the high voltage MOS device.

16. The method of claim 15 further comprising:
after the implanting the portion of the body layer to form the doped semiconductor region, forming a dielectric layer over the first and the second gate electrodes; and
forming a conductive field plate over the dielectric layer, wherein the conductive field plate extends into the space between the first and the second gate electrodes.

17. The method of claim 15 further comprising:
implanting the body layer to form heavily doped regions on opposite sides of a combined region comprising the first gate electrode and the second gate electrode; and
etching portions of the body layer to expose sidewalls of the heavily doped regions.

18. The method of claim 17, wherein the source region comprises a metal, and the source region is in contact with the sidewalls of the heavily doped regions.

19. The method of claim 15, wherein the source region comprises a portion filled into the space, with the portion of the source region being level with the first gate electrode and the second gate electrode.

20. The method of claim 16, wherein the dielectric layer comprises a portion in the space, and the portion of the dielectric layer is directly underlying a portion of the conductive field plate extending into the space.

* * * * *